(12) United States Patent
Ito et al.

(10) Patent No.: US 10,680,405 B2
(45) Date of Patent: Jun. 9, 2020

(54) SEMICONDUCTOR LIGHT-EMITTING DEVICE

(71) Applicant: SHARP KABUSHIKI KAISHA, Sakai, Osaka (JP)

(72) Inventors: Shigetoshi Ito, Sakai (JP); Kazuaki Kaneko, Sakai (JP); Teruyuki Oomatsu, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/290,217

(22) Filed: Mar. 1, 2019

(65) Prior Publication Data

US 2019/0280460 A1 Sep. 12, 2019

(30) Foreign Application Priority Data

Mar. 6, 2018 (JP) .................................. 2018-040058

(51) Int. Cl.
| | |
|---|---|
| *H01S 5/024* | (2006.01) |
| *H01S 5/022* | (2006.01) |
| *H01S 5/40* | (2006.01) |
| *H01S 5/02* | (2006.01) |
| *H01S 5/00* | (2006.01) |
| *H01S 5/323* | (2006.01) |
| *H01S 5/0683* | (2006.01) |

(52) U.S. Cl.
CPC ............ *H01S 5/02469* (2013.01); *H01S 5/02* (2013.01); *H01S 5/02212* (2013.01); *H01S 5/02276* (2013.01); *H01S 5/02296* (2013.01); *H01S 5/323* (2013.01); *H01S 5/4025* (2013.01); *H01S 5/005* (2013.01); *H01S 5/02216* (2013.01); *H01S 5/02292* (2013.01); *H01S 5/0683* (2013.01)

(58) Field of Classification Search
CPC .... H01S 5/02212; H01S 5/4025; H01S 5/323; H01S 5/005; H01S 5/02216; H01S 5/02296
USPC ................................................................ 372/36
See application file for complete search history.

(56) References Cited

U.S. PATENT DOCUMENTS

| | | | | |
|---|---|---|---|---|
| 5,018,005 | A * | 5/1991 | Lin ........................ | H01L 22/00 257/730 |
| 10,330,872 | B2 * | 6/2019 | Rosenberg ........... | G02B 6/4251 |
| 2003/0210729 | A1 * | 11/2003 | Nakaya ................... | H01S 5/146 372/97 |

(Continued)

FOREIGN PATENT DOCUMENTS

| | | |
|---|---|---|
| JP | H05-129711 A | 5/1993 |
| JP | H07-162092 A | 6/1995 |
| JP | 2006-135219 A | 5/2006 |

*Primary Examiner* — Tuan N Nguyen
(74) *Attorney, Agent, or Firm* — ScienBiziP, P.C.

(57) ABSTRACT

A semiconductor light-emitting device 10 includes a heat sink and a semiconductor light-emitting element mounted on the heat sink. A gap is provided between a region of a part of a base bottom surface of a base of the semiconductor light-emitting element and an upper surface of the heat sink, and a lead is disposed in a region where the gap is provided so as to vertically pass through the base. A semiconductor laser chip is provided in a region where the gap is not provided so that its waveguide longitudinal direction is substantially parallel to an upper surface of the base. The lead has its lower end located within the gap and connected to a flexible substrate.

11 Claims, 9 Drawing Sheets

(56) References Cited

U.S. PATENT DOCUMENTS

| 2004/0165627 A1* | 8/2004 | Matsubara | H01S 5/02216 |
| | | | 372/36 |
| 2004/0228378 A1* | 11/2004 | Inoue | G11B 7/127 |
| | | | 372/36 |
| 2006/0018351 A1* | 1/2006 | Matsubara | H01S 5/02292 |
| | | | 372/43.01 |

* cited by examiner

SEMICONDUCTOR LIGHT-EMITTING DEVICE

BACKGROUND

1. Field

The present disclosure relates to a semiconductor light-emitting device including a heat sink and a can-type semiconductor light-emitting element mounted on the heat sink.

2. Description of the Related Art

In the field of a variety of industries, semiconductor light-emitting devices mounted with semiconductor laser chips are currently utilized. Widely-used examples of such semiconductor light-emitting devices include one that includes a can-type semiconductor light-emitting element such as that disclosed in Japanese Unexamined Patent Application Publication No. 2006-135219 or the like.

FIG. 13 is a cross-sectional view of a conventional can-type semiconductor light-emitting element. This semiconductor light-emitting element includes a base 901, a block 902, a sub-mount 903, and a semiconductor laser chip 904. The base 901 is a plate member made of metal. The block 902 is made of metal and provided on the base 901 so as to protrude. The semiconductor laser chip 904 is mounted lateral to the block 902 with the sub-mount 903 interposed between the block 902 and the semiconductor laser chip 904. A laser beam that is emitted from an end face of the semiconductor laser chip 904 is emitted upward in a direction perpendicular to the base 901.

Leads 907 are fixed to the base 901 by glass hermetic sealing to secure insulation and airtightness. Note, however, that a lead (not illustrated) that is electrically in common with a stem is fixed so as to be directly connected to the stem. The leads 907 and the semiconductor laser chip 904 are connected as appropriate by a wire for current introduction. It should be noted that in order to avoid complicated illustration, FIG. 13 omits to illustrate the wire.

A cap 905 is bonded to the base 901 by electric resistance welding or the like in order to cover the semiconductor laser chip 904 for hermetic sealing. The cap 905 is provided with a window 906, made of glass, through which to take out output light from the semiconductor laser Chip 904. The window 906 is bonded to the cap 905 for airtightness. Typically, the planar shape of the base 901 is a circle.

Such can-type semiconductor light-emitting elements are composed of packages made of metal and therefore provide good radiation performance. For even higher radiation performance, they are generally used as semiconductor light-emitting devices attached to members made of metal. Further, can-type semiconductor light-emitting elements allow use of established technologies such as bonding of metals by welding or the like, low-melting-point glassing of window glass to a metallic cap, and glass hermetic sealing. For this reason, can-type semiconductor light-emitting elements are widely used in semiconductor light-emitting devices, as they are comparatively low in member cost and assembly cost and capable of rigorously hermetically sealing laser chips.

Another possible configuration of a semiconductor light-emitting element is a package in which a block 902 such as that shown in FIG. 13 is not used but a laterally-facing semiconductor laser chip or the like is mounted directly on a base (metal plate) (Japanese Unexamined Patent Application Publication No. 7-162092 and Japanese Unexamined Patent Application Publication No. 5-129711). In such a package structure, the direction of emission of light from the semiconductor laser chip is parallel to the base. Therefore, there is known a semiconductor light-emitting element configured to, using a mirror that reflects emitted light upward, emit light perpendicularly to the base as a result.

Such a type of semiconductor light-emitting element has a shorter pathway of heat radiation to a bottom surface of the base, as the semiconductor laser chip is mounted sideways over the base. In comparison with the semiconductor light-emitting element of FIG. 13, which radiates heat from the base via the protruding block, such a type of semiconductor light-emitting element is expected to provide better radiation performance. Further, at the point of use, these semiconductor light-emitting elements too can be used as semiconductor light-emitting devices attached to members for heat radiation.

Semiconductor light-emitting elements are expected to be developed as various light sources such as light sources for 3D printers, light sources for molding and processing, light sources for projectors, and light sources for lighting by increasing light output from semiconductor laser chips to the watt class or higher. In the field of such applications, there is a demand for an increase in laser output from individual packages through improvement in heat radiation from the packages. Furthermore, there is also a demand for utilization of a plurality of integrated packages as a further high-power light source by gathering output light with an optical system.

These applications require a semiconductor light-emitting element to operate with high input power, making it necessary to efficiently let out heat generated from the semiconductor light-emitting element. For that purpose, the semiconductor light-emitting element is inevitably attached to a heat sink for use. FIG. 14 is a diagram schematically showing a cross-section of a heat sink 910 with the conventional can-type semiconductor light-emitting element shown in FIG. 13 attached to the heat sink 910.

In FIG. 14, the semiconductor light-emitting element has its leads 907 extending from the bottom surface of the base. For this reason, attaching the semiconductor light-emitting element to the heat sink 910 makes it necessary to bore holes 911 through the heat sink 910 and run the leads 907 through the holes 911. At this time, the leads 907 are covered with tubular insulating members 912 to be electrically insulated from the heat sink 910. The leads 907 are electrically connected to a mounting substrate, wires, and the like via electrical connections 913 such as soldering, whereby a pathway of current introduction to the semiconductor light-emitting element is formed. It should be noted that in order to avoid complicated illustration, FIG. 14 omits to illustrate members (wiring members such as a mounting substrate and covered wires) to which the leads 907 are connected.

A configuration of such a heat sink 910 makes it necessary to provide the holes 911, a recess 914, and the like in a region in the semiconductor light-emitting element near the lower side of the semiconductor laser chip 904 that is supposed to contribute to heat radiation most. The recess 914 is a space for connecting the leads 907 by soldering. Providing the heat sink 910 with the holes 911 and the recess 914 impairs a pathway of heat radiation from the semiconductor laser chip 904 to directly below and makes it not easy to sufficiently secure an area of contact between a bottom surface of the semiconductor light-emitting element and the heat sink 910. This poses big problems in achieving improvement in heat radiation of the semiconductor light-emitting element.

In a case where such a can-type semiconductor light-emitting element is used, simply increasing the size of the whole package may lead to an increase in area of contact of the semiconductor light-emitting element with the heat sink 910. However, increasing the package size of the semiconductor light-emitting element of course inhibits miniaturization of a device and, in particular, poses an impediment to the foregoing application of high-density integration. That is, a decrease in integration density of a plurality of semiconductor light-emitting elements makes it more difficult to gather output light with an optical system, and this goes against the purpose of utilizing a high-power laser beam.

The semiconductor light-emitting element described in Japanese Unexamined Patent Application Publication No. 7-162092 is structured such that leads extends from a bottom surface of the base, as is the case with the semiconductor light-emitting element shown in FIG. 13. Therefore, this semiconductor light-emitting element still has the aforementioned problem of attachment to a heat sink and cannot sufficiently bring out the merit of improvement in radiation performance.

The semiconductor light-emitting element described in Japanese Unexamined Patent Application Publication No. 5-129711 is structured such that a frame is made around a metal plate and leads are disposed to run through the frame. In this structure, a flat metal plate is exposed at a bottom surface of the package and the leads do not protrude downward from the package. This eliminates the problem of attachment of the semiconductor light-emitting element to a heat sink, and heat generated during operation of the semiconductor laser chip can be radiated through the metal plate to directly below. This brings about a great improvement in radiation effect.

However, the semiconductor light-emitting element described in Japanese Unexamined Patent Application Publication No. 5-129711 is not a can-type package in the first place, and the drawing of the leads from the semiconductor light-emitting element does not involve the use of a glass hermetic sealing technology. It is conceivable that the semiconductor light-emitting element of Japanese Unexamined Patent Application Publication No. 5-129711 may be configured such that the leads are sealed with resin or the like; however, such resin sealing is more insufficient to inhibit gas from leaking outside than sealing of the leads by a hermetic sealing technology. Therefore, for example, use of this packaging technology for a blue laser poses a problem such as aged deterioration of the laser chip.

Further, when the frame is made of ceramic or the like in the semiconductor light-emitting element of Japanese Unexamined Patent Application Publication No. 5-129711, the package for achieving airtight sealing is so expensive that the cap cannot be seal-attached by highly productive electric resistance welding unlike in the case of a conventional can type. That is, the semiconductor light-emitting element of Japanese Unexamined Patent Application Publication No. 5-129711 cannot enjoy the merits of a can-type semiconductor light-emitting element such as comparatively good heat radiation, low packaging and manufacturing costs, and the capability of rigorously hermetically sealing a laser chip.

It is desirable to provide a semiconductor light-emitting device that is used with a can-type semiconductor light-emitting element attached to a heat sink and that makes it possible to further improve radiation performance.

SUMMARY

According to an aspect of the disclosure, there is provided a semiconductor light-emitting device including a heat sink made of metal and a semiconductor light-emitting element, mounted on the heat sink, that has a base. The heat sink is larger in area than the base. The semiconductor light-emitting element includes the base made of sheet metal, a cap, mounted on the base, that includes a window made of an optically transparent member, a semiconductor light-emitting chip, mounted over an upper surface of the base, that includes a waveguide, an optical path bending member that converts an optical path of an emitted beam from a waveguide edge of the semiconductor light-emitting chip into an upward optical path and lets the emitted beam exit through the window, and a lead for supplying electric power to the semiconductor light-emitting chip. An upper end of the lead, the semiconductor light-emitting chip, and the optical path bending member are stored in an internal space surrounded by the cap and the base. The base is mounted on the heat sink and provided with a gap between a region of a part of a lower surface of the base and an upper surface of the heat sink. The semiconductor light-emitting chip is disposed in a region other than a region where the gap is provided so that a waveguide longitudinal direction of the semiconductor light-emitting chip is substantially parallel to the upper surface of the base. The lead is disposed in the region where the gap is provided so as to vertically pass through the base. The lead has its lower end located within the gap and connected to a flexible substrate.

DESCRIPTION OF THE EMBODIMENTS

Embodiment 1

Configuration of Semiconductor Light-Emitting Device

Figure 1:
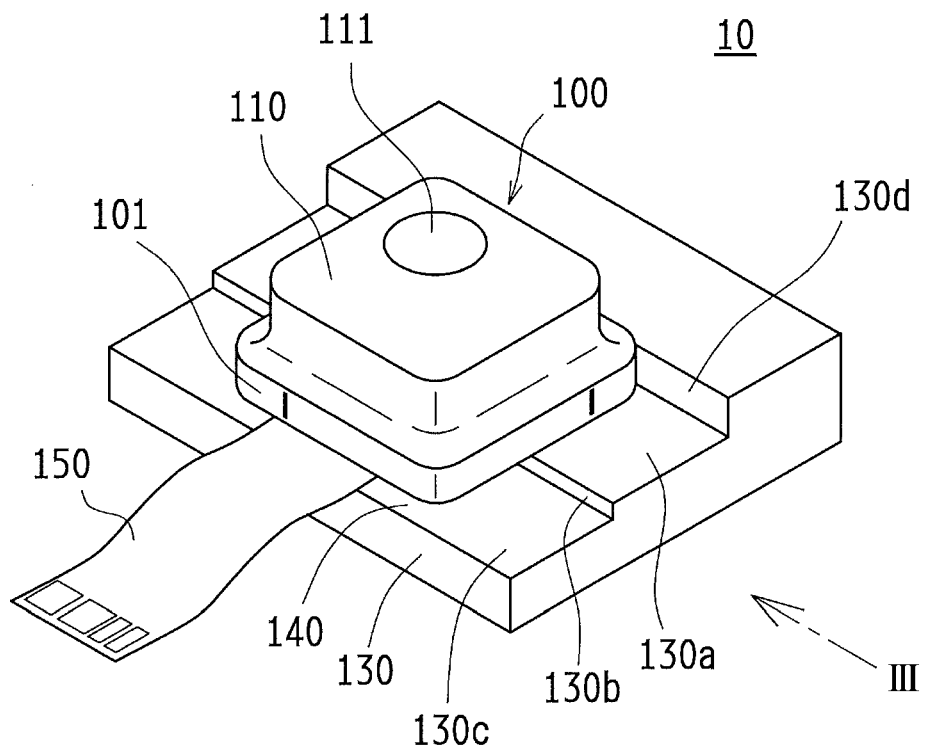
FIG. 1 is a perspective view showing a semiconductor light-emitting device according to Embodiment 1.
Figure 2:
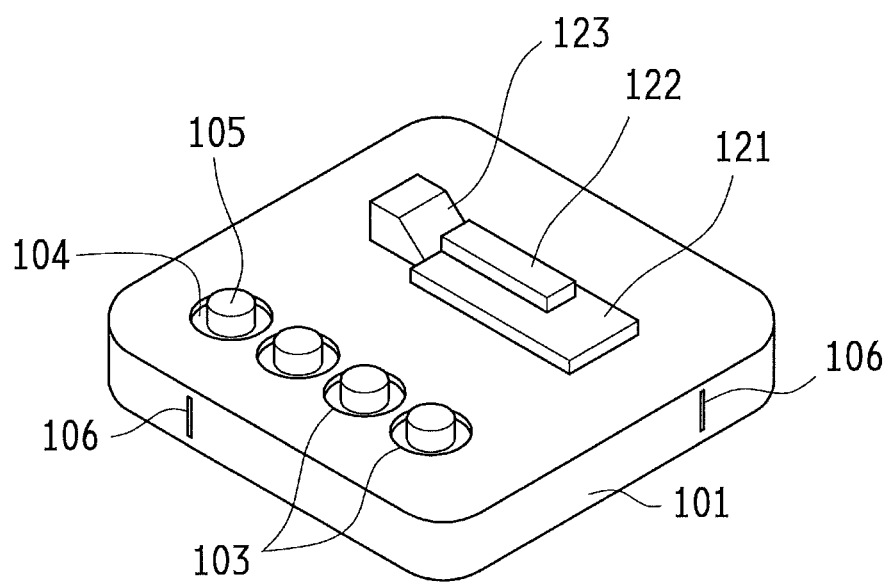
FIG. 2 is a perspective view showing an internal structure of a semiconductor light-emitting element that is mounted on the semiconductor light-emitting device of FIG. 1, with a cap of the semiconductor light-emitting element removed.
Figure 3:
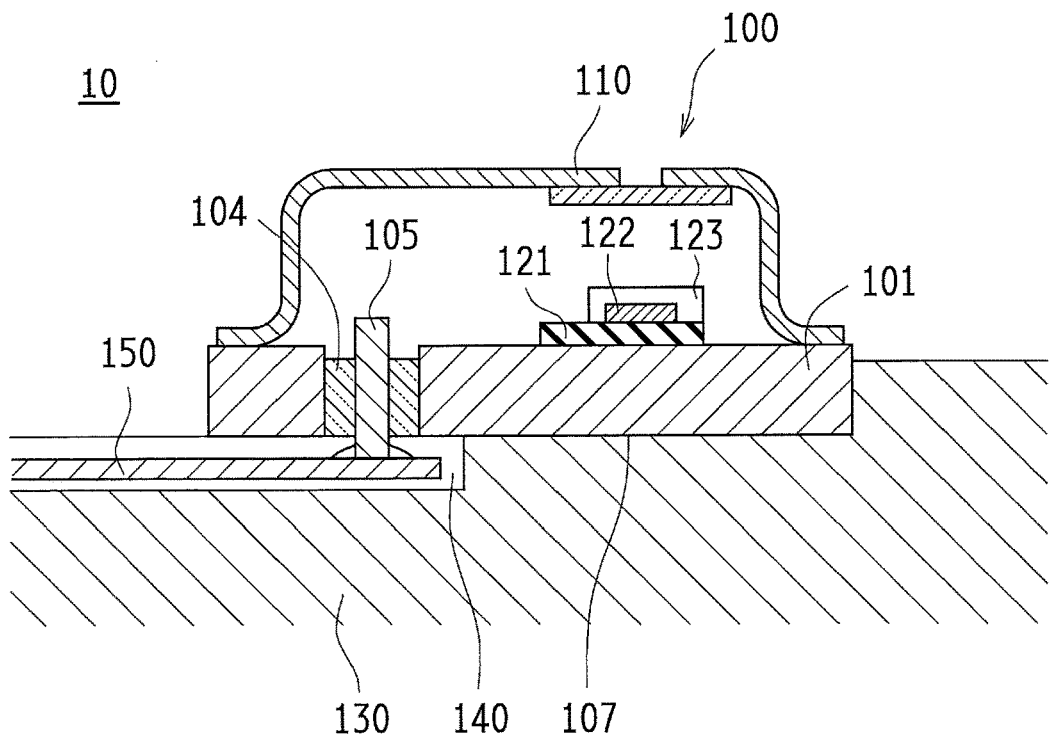
FIG. 3 is a local cross-sectional view of the semiconductor light-emitting device as observed from an angle indicated by sign III in FIG. 1.

Embodiments of the present disclosure are described in detail below with reference to the drawings. FIG. 1 is a perspective view showing a semiconductor light-emitting device 10 according to Embodiment 1. The semiconductor light-emitting device 10 includes a can-type semiconductor light-emitting element 100 mounted on a heat sink 130. FIG. 2 is a perspective view showing an internal structure of the semiconductor light-emitting element 100 with its cap 110 removed. FIG. 3 is a local cross-sectional view of the semiconductor light-emitting device 10 as observed from an angle indicated by sign III in FIG. 1.

The semiconductor light-emitting element 100 includes a base 101 and a cap 110. The base 101 is made of sheet metal and has an upper surface (chip-mounting surface) that is a substantially flat surface. The cap 110 is mounted on the upper surface of the base 101 by being bonded (by electric resistance welding or the like) near the surrounding areas of the base 101. This causes the semiconductor light-emitting element 100 to have an internal space that is formed by the base 101 and the cap 110 and to be configured to be able to seal this internal space. In Embodiment 1, when seen in a plan view, the base 101 has a substantially square shape having rounded corners. The cap 110 has a window 111 formed in an upper surface thereof. The window 111 is made of glass. Further, a lower surface of the base 101 is a flat surface and constitutes a base bottom surface 107.

The base 101, which has a substantially square shape, has a plurality of through holes 103 provided along one peripheral side of the base 101. A lead 105 made of metal is inserted in each of the through holes 103 so as to protrude upward and downward in a thickness direction of the base 101. A space between each of the through holes 103 and the corresponding lead 105 is filled with glass 104, and the lead 105 is fixed to the base 101 while having good insulating properties with the base 101.

Note here that the lead 105 has a substantially linear shape and has its lower end located slightly below the base bottom surface 107. Further, the lead 105 has its upper end located in the internal space of the semiconductor light-emitting element 100 surrounded by the base 101 and the cap 110. In the internal space, a sub-mount 21 is placed on the upper surface of the base 101 and a semiconductor laser chip (semiconductor light-emitting chip) 122 is mounted on the sub-mount 121. The semiconductor laser chip 122 is placed parallel to the upper surface of the base 101, and a laser beam that is sent out from a light emission surface of the semiconductor laser chip 122 is once emitted parallel to the upper surface of the base 101. A mirror (optical path bending member) 123 is placed so as to face the light emission surface of the semiconductor laser chip 122. A laser beam that is sent out from the semiconductor laser chip 122 travels upward by having its optical path bent by the mirror 123, and is sent out outward through the window 111 of the cap 110.

In Embodiment 1, the semiconductor laser chip 122 has a waveguide longitudinal direction (i.e. the direction of a laser guided wave inside a laser) that is substantially parallel to the direction in which the through holes 103 are arranged. Further, a sensor for monitoring a light output level may be disposed as needed in the internal space of the semiconductor light-emitting element 100.

Although not illustrated for the avoidance of complication, the lead 105 is connected via a metal wire such as a gold wire or a gold ribbon to an electrode pad provided on the semiconductor laser chip 122 or the sub-mount 121. This is achieved by the upper end of the lead 105, the semiconductor laser chip 122, and the sub-mount 121 being stored in the internal space of the semiconductor light-emitting element 100. The same applies to the sensor that is disposed as needed in the internal space.

In the semiconductor light-emitting element 100, the direction in which a plurality of the leads 105 are arranged and the waveguide longitudinal direction of the semiconductor laser chip 122 are substantially parallel to each other. For this reason, these metal wires do not interfere with an optical path of a laser beam that is sent out from the semiconductor laser chip 122, bent by the mirror 123, and emitted out of the semiconductor light- emitting element 100.

In the semiconductor light-emitting device 10, the heat sink 130, which is combined with the semiconductor light-emitting element 100, has its upper surface stepped in a region where the base 101 is mounted. That is, the upper surface of the heat sink 130 has a first flat surface 130a that makes close contact with the base bottom surface 107 of the semiconductor light-emitting element 100, a step surface 130b that extends downward from the first flat surface 130a, and a second flat surface 130c that is located in a lower position than the first flat surface 130a by the step surface 130b. Accordingly, the semiconductor light-emitting device 10 has a gap 140 formed between the second flat surface 130c and the base bottom surface 107. Note here that the step surface 130b is parallel to one side of the base 101 along which the plurality of through holes 103 are arranged, and the gap 140 is provided along one side of the base 101, which has a substantially square shape. Further, the leads 105 have their lower ends fitted in the gap 140.

An important point of the semiconductor light-emitting device 10 is that a region in the base 101 on which the semiconductor laser chip 122 is mounted and a region where the base bottom surface 107 makes close contact with the heat sink 130 correspond to each other. That is, as shown in FIG. 3, the semiconductor laser chip 122 is placed in a region where the gap 140 is not provided.

In the gap 140, the leads 105 have their lower ends connected to a flexible substrate 150 that is drawn out through the gap 140. This constitutes a configuration in which the semiconductor laser chip 122 can be supplied with electric power through the flexible substrate 150 and the leads 105. This also makes it possible to appropriately extract an electrical signal from the sensor stored in the internal space. The flexible substrate 150 is extremely thin, as it is one obtained by providing wires on a base film. As such, the flexible substrate 150 allows a power supply terminal to be drawn out through the narrow gap 140. The gap 140 may have a height of, for example, 2 mm. A desirable range of he fight of the gap 140 will be described later.

The base 101 may have its side surface appropriately provided with a marker 106 that serves as a benchmark for a position of light emission. The marker 106 may be a printed mark or may be a depression or a protrusion provided in or on the side surface of the base 101. Further, the marker 106 may be provided in a part of the base 101 other than the side surface.

Furthermore, the semiconductor light-emitting device 10 may be configured such that the heat sink 130 further has a step surface 130*d* and a side surface of the base 101 that is close to the semiconductor laser chip 122 makes direct contact with the step surface 130*d* of the heat sink 130. This makes it possible to further enhance the conduction of heat from the base 101 to the heat sink 130.

Although the heat sink 130 has its overall shape drawn in substantially quadrangular plate form in FIG. 1, the heat sink 130 may of course take any of various shapes, as the semiconductor light-emitting device 10 is fixedly placed in a housing of an apparatus depending on the intended use.

Manufacturing Method

The following describes a method for manufacturing a semiconductor light-emitting device 10 according to Embodiment 1.

The base 101, which is made of metal, can be molded by using a well-known technique for manufacturing a can-type package. A material of the base 101 can be selected from among publicly-known package materials such as a material composed mainly of iron and a material composed mainly of copper. Since the material composed mainly of iron has the merit of making welding of the cap 110 easy and the material composed mainly of copper has the merit of being superior in radiation performance, the material of the base 101 can be selected as appropriate depending on the required characteristics of the semiconductor light-emitting device 10. Further, the base 101 is not limited to a member made of a material that is uniform in its entirety, but a so-called laminated material can alternatively be used. Use of press working for the molding of the base 101 makes it possible to manufacture the base 101 with high mass-producibility and at low cost. Meanwhile, use of brazing or welding makes it possible to select a plurality of right materials for the right parts of the base 101 and make up the base 101 of a complex combination. Normally, the base 101 has its surface plated with gold, nickel, palladium, or the like.

The lead 105, which is made of metal, is fixed to the base 101 by a glass hermetic technique while being airproofed. By being plated with gold, nickel, or the like, the lead 105 allows a metal wire and solder to make a good connection and can achieve excellent electrical conductivity.

The semiconductor laser chip 122 is mounted on the sub-mount 121, which has insulation properties, and mounted over the upper surface of the base 101. The sub-mount 121 can be made of ceramic composed mainly of aluminum nitride, silicon carbide, or the like. Note, however, that the semiconductor laser chip 122 may be mounted directly on the base 101 and, in this case, improvement in radiation performance is especially brought about, as heat can be directly radiated from the semiconductor laser chip 122 to the base 101.

The semiconductor laser chip 122 can be fixed onto the base 101 or the sub-mount 121 by using a publicly-known technique such as soldering or conductive paste bonding. In so doing, a publicly-known bonding material can be used. Further, the sub-mount 121 can be made of a conducting material such as metal or another publicly-known material. In FIG. 2, the upper surface of the base 101 is totally flat, and the sub-mount 121 is mounted on the flat surface. Note, however, that a depression or a protrusion can be provided as appropriate in or on the upper surface of the base 101 insofar as the radiation of heat to the heat sink 130 is not greatly inhibited, and the sub-mount 121 can be mounted on this depression or protrusion.

A usable example of the mirror 123 for bending an optical path is one obtained by coating a surface of a prism-shaped glass member with a highly reflective film. Such a glass member can be fixed to the base 101 by an adhesive, soldering, or the like. Instead of being constituted by the aforementioned glass member, the mirror 123 can be made of a publicly-known mirror material such as a semiconductor material or a metal material. Furthermore, as disclosed in Japanese Unexamined Patent Application Publication No. 7-162092, the mirror 123 can be formed integrally with the base 101 as an inclined surface of the depression or protrusion formed in or on the base 101. Alternatively, as the member for bending an optical path, a prism or a diffraction grating may be used instead of the mirror 123.

The connection between the electrode pad provided on the semiconductor laser chip 122 or the sub-mount 121 and the lead 105 by the metal wire precedes the bonding of the cap 110 to the base 101.

As the cap 110, a cap according to a publicly-known technology that is used as a cap of a can-type package can be used. Such a cap is hermetically attached by an established technology to a window member, is mass-producible, and is inexpensive. It is desirable, for the purpose of high productivity, low cost, secure sealing, that the cap 110 be attached to the base 101 by well-known electric resistance welding, he following is an outline of a technique for attaching the cap 110 to the base 101 by an electric resistance welding method. First, the base 101 is fixed to an energizable stage. The cap 110 is set on an energizable jig. A welded part that is a flange surrounding a bottom surface of the cap 110 is put between the jig and the stage and pressurized, and a pulsed current is passed between the stage and the jig, whereby the welded part is instantaneously heated and welded. The electric resistance welding method is low in cost because of instantaneous completion of welding, an extremely short lead time, and suitability for mass production. Another reason is that a welding apparatus is low in cost, as it is constituted by a smaller number of movable parts that require precise positioning as in the case of seam welding or laser welding. Note, however, that the electric resistance welding method is not the only method for bonding the cap 110 to the base 101. It is possible to use another bonding method such as seam welding, laser welding, brazing, or soldering.

Furthermore, the lead 105, which slightly protrudes from the base bottom surface 107 of the semiconductor light-emitting element 100, is connected to the flexible substrate 150. Such an electrical connection may involve the use of a publicly-known technology.

After that, the base bottom surface 107 of the semiconductor light-emitting element 100 is contact-fixed to the surface of the heat sink 130 in alignment with the aforementioned predetermined position, whereby the semiconductor light-emitting device 10 is completed. Such contact fixing appropriately involves the use of a publicly-known bonding technology such as electric resistance welding, another welding technology, adhesive bonding, brazing, or soldering or a publicly-known technique such as screw, spring, or clip fixing.

Method of Use

A method of use of a semiconductor light-emitting device 10 according to Embodiment 1 is described When the semiconductor laser chip 122 is supplied with electric power through the flexible substrate 150 drawn out through the gap 140, a laser oscillation operation takes place, so that a laser beam is emitted upward through the window 111 of the semiconductor light-emitting element 100.

In the semiconductor light-emitting device 10, the lead 105 does not greatly protrude from the base bottom surface 107 and has its lower end fitted in the gap 140, so that the base bottom surface 107 can be brought into close contact with the heat sink 130 except for a part corresponding to the gap 140. When seen in a plan view, the semiconductor laser chip 122 and the sub-mount 121 are placed in such a position as not to overlap a region in the base 101 where the gap 140 is present. This causes the semiconductor light-emitting device 10 to be structured such that a region near the lower side of the semiconductor laser chip 122 that is supposed to contribute to heat radiation most is in direct contact with the heat sink 130. Not only that, the semiconductor laser chip 122 and the sub-mount 121 are placed directly on the upper surface of the base 101. This allows heat to be favorably radiated from the semiconductor laser chip 122 to the base 101. Furthermore, since the gap 140, which is present in a part of a space between the base 101 and the heat sink 130, extends in a transverse direction of the heat sink 130 that is a direction parallel to the base bottom surface 107, the gap 140 does not prevent heat conducted from the base 101 from spreading in a transverse direction within the heat sink 130. These factors allow heat to be extremely favorably radiated from the semiconductor laser chip 122 to the heat sink 130 in the semiconductor light-emitting device 10 as compared with a conventional the semiconductor light-emitting device.

At a surface of contact between the base 101 and the heat sink 130, it is desirable, from the point of view of transversely spreading heat transferred from the base 101 to the heat sink 130, that the he of the gap 140 be narrow, and it is necessary that the height take on a value that is approximately equal to or smaller than the thickness of the base 101. Since the base 101 is in close contact with the heat sink 130 in the semiconductor light-emitting device 10, such a configuration is desirable that the base 101 is thinner in thickness so as to actively let out heat to the heat sink 130. However, from the point of view of strength, the thickness of the base 101 is normally 0.5 mm or larger and typically approximately 1 to 4 mm. Accordingly, it is preferable that the desirable range of height of the gap 140 be 4 mm or smaller, and from the point of view of securing a connection with the lead 105, it is preferable that the desirable range of height of the gap 140 be 0.1 mm or larger. That is, it is desirable that the height of the gap 140 be 0.1 mm or larger and equal to or smaller than the thickness of the base 101 or be 0.1 mm or larger and 4 mm or smaller.

Figure 12:
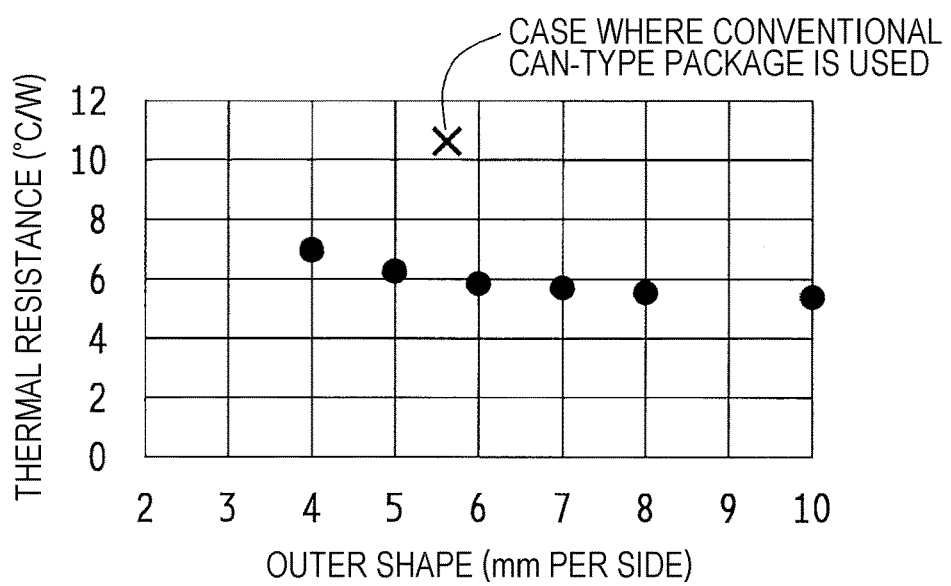
FIG. 12 is a graph showing results of evaluation of the thermal resistance of semiconductor light-emitting elements according to examples of the present disclosure.

FIG. 12 is a graph showing results of evaluation of thermal resistance in a semiconductor light-emitting device 10 according to Embodiment 1. The value of thermal resistance of a pathway from a PN junction to the heat sink 130 is evaluated here. The PN junction is a heat-generating part of the semiconductor laser chip 122. Further, the waveguide width (heat-generating region width) of the semiconductor laser chip 122, which is made of a nitride semiconductor, is 30 μm, and the sub-mount 121 is made of aluminum nitride and mounted on the sub-mount 121 junction down. The base 101 is made of copper, and the heat sink 130 is made of iron.

Figure 13:
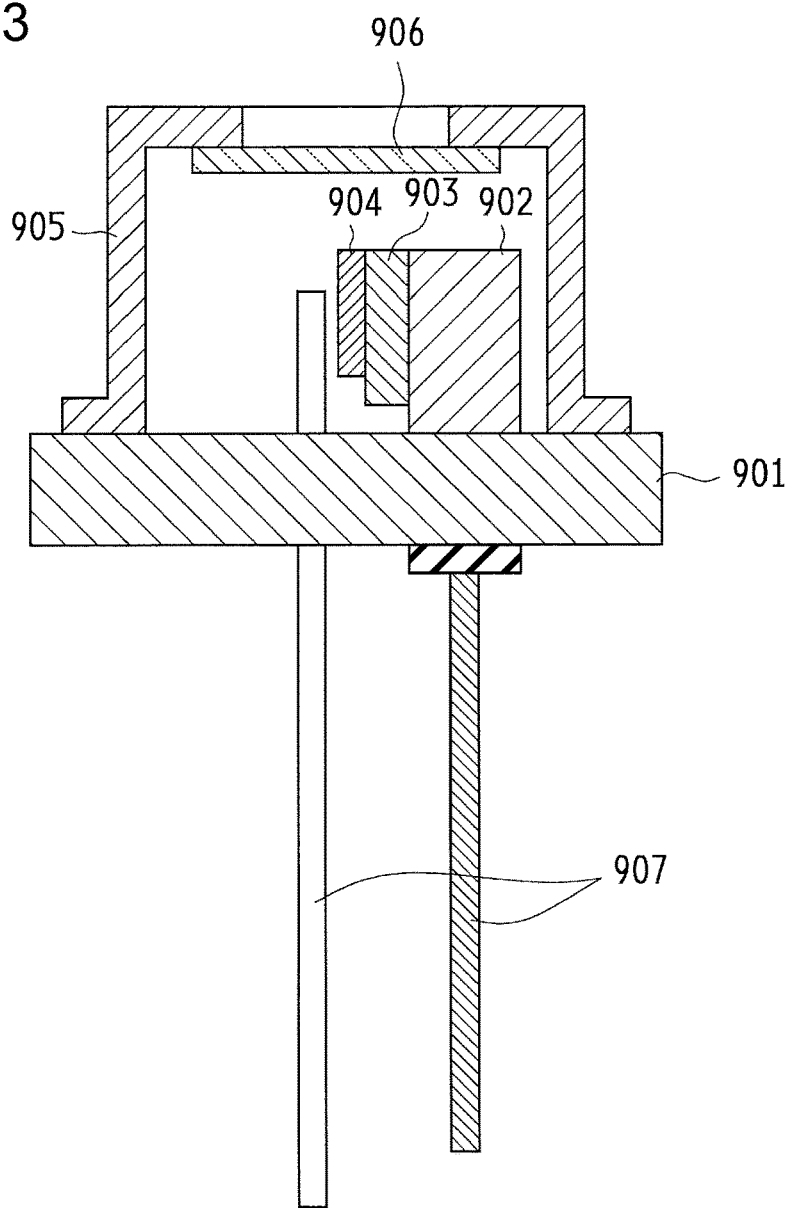
FIG. 13 is a cross-sectional view showing a conventional can-type semiconductor light-emitting element.
Figure 14:
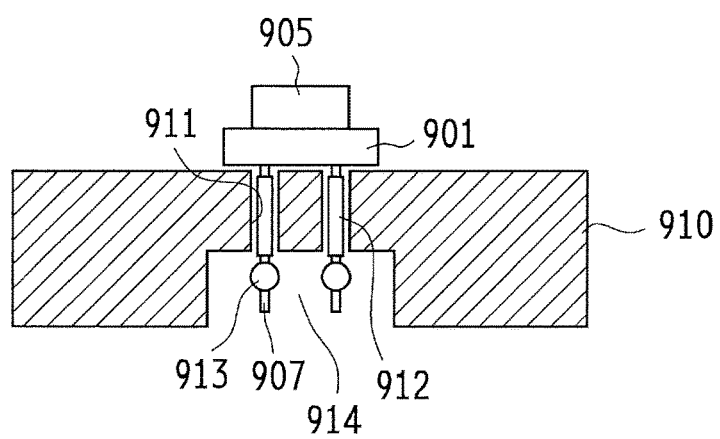
FIG. 14 is a diagram schematically showing a state where the conventional can-type semiconductor light-emitting element is attached to a heat sink.

Under the foregoing conditions, the value of thermal resistance of in a semiconductor light-emitting device whose base 101 has an outer shape measuring 6 mm per side is a value of a little under 6° C./W, and a comparison with the value 10.5° C./W of the case where a standard conventional can-type package (with a diameter of 5.6 mm) such as that shown in FIG. 13 is used clearly shows remarkable improvement in thermal resistance. Further, once the size of a base 101 measures approximately 5 mm or larger per side, a further increase in package size only leads to a gentle decrease in thermal resistance. With base sizes of 5 to 6 mm, a substantial reduction in thermal resistance can be achieved as mentioned above, although the bases are nearly equal in outer shape to the base of the conventional can-type package with a diameter of 5.6 mm. This makes it possible to miniaturize the semiconductor light-emitting device 10 and to reduce member costs.

The semiconductor light-emitting device 10 according to Embodiment 1 exhibits extremely good radiation performance in comparison with the case where a conventional can-type semiconductor package is used. This makes it possible to make the light output from the semiconductor laser chip several times higher. Meanwhile, in terms of sealing of the semiconductor laser chip, there is no difference from a conventional can-type package, as a hermetic sealing technology, resistance welding, and a metallic cap can be used. This makes an extremely rigorous cutoff from toe outside air possible. Therefore, deterioration of the semiconductor laser chip due to use is favorably reduced in a manner similar to the case where a conventional can-type package is used. This deterioration-reducing effect appears prominently in a case where a semiconductor laser chip made of a nitride semiconductor is used.

Embodiment 2

Figure 4:
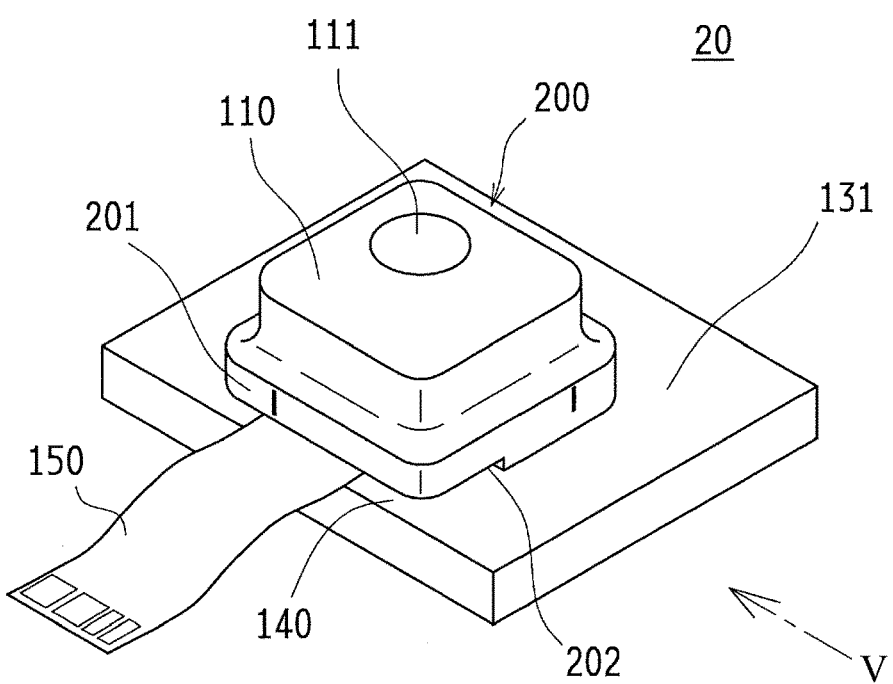
FIG. 4 is a perspective view showing a semiconductor light-emitting device according to Embodiment 2.
Figure 5:
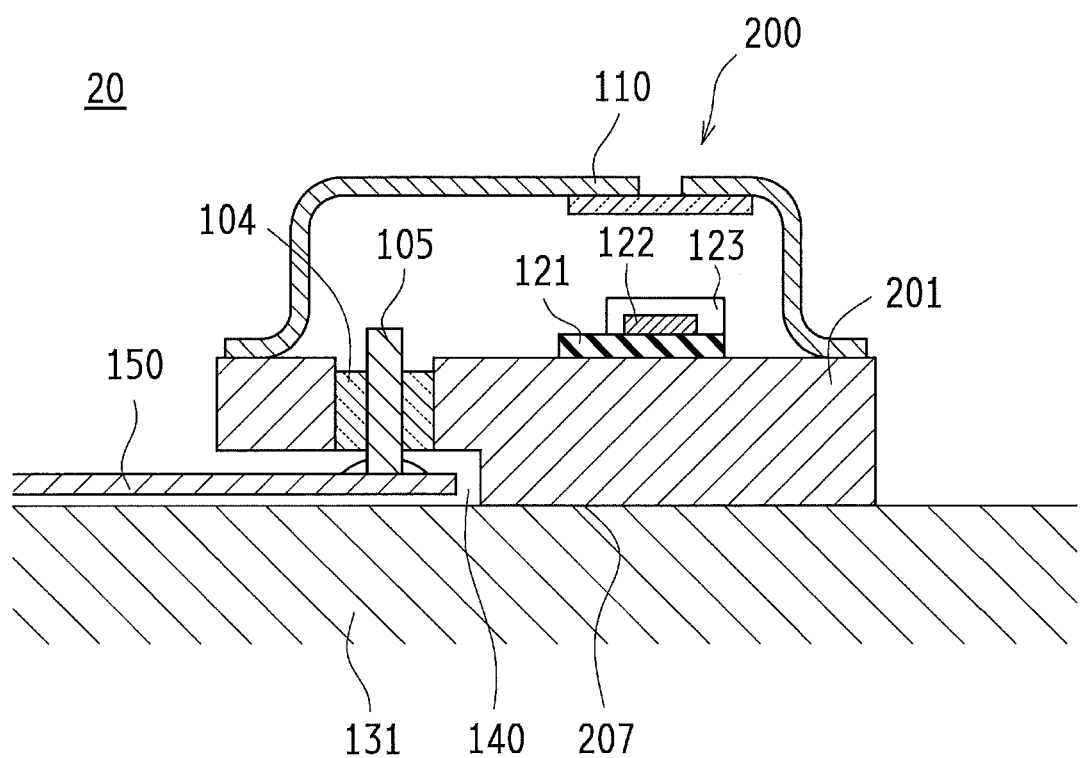
FIG. 5 is a local cross-sectional view of the semiconductor light-emitting device as observed from an angle indicated by sign V in FIG. 4.

A semiconductor light-emitting device according to Embodiment 2 is described with reference to FIGS. 4 and 5. FIG. 4 is a perspective view showing a semiconductor light-emitting device 20 according to Embodiment 2, and FIG. 5 is a local cross-sectional view of the semiconductor light-emitting device 20 as observed from an angle indicated by sign V in FIG. 4.

The semiconductor light-emitting device 20 includes a heat sink 131 and a can-type semiconductor light-emitting element 200 mounted on the heat sink 131. The semiconductor light-emitting element 200 differs from the semiconductor light-emitting element 100 according to Embodiment 1 in that a base 201 is used instead of the base 101. That is, the semiconductor light-emitting element 200 is basically identical in internal space configuration to the semiconductor light-emitting element 100. Further, the heat sink 131 differs in shape from the heat sink 130 according to Embodiment 1.

The base 201 differs in lower surface shape from the base 101, and in a part of the lower surface of the base 201, a notch 202 is provided along one side of an outer shape. For this reason, in the region where the notch 202 is provided, the base 201 is thinner in thickness than in other regions.

The plurality of through holes 103 are provided in the region of the notch 202 and arranged side by side along the side along which the notch 202 is provided. A lead 105 placed in each of the through holes 103 protrudes upward and downward from the base 201 and has its lower end fitted in the notch 202, i.e. located above a base bottom surface 207.

An upper surface of a region in the heat sink 130 on which the base 201 is mounted is flat. This causes a gap 140 to be formed in the region of the notch 202 between the base 201 and the heat sink 130. As in Embodiment 1, in the gap 140, the leads 105 have their lower ends connected to a flexible substrate 150 that is drawn out through the gap 140. This allows the semiconductor laser chip 122 to be supplied with electric power through the flexible substrate 150 and the leads 105. This also makes it possible to extract an electrical signal from a sensor stored as appropriate in an internal space of the semiconductor light-emitting element 200.

In a region in the base 201 on which the semiconductor laser chip 122 is mounted, the base bottom surface 207 is in close contact with the heat sink 131. That is, as in Embodiment 1, the semiconductor laser chip 122 is placed in a region where the gap 140 is not provided.

Thus, the semiconductor light-emitting device 20 according to Embodiment 2 too exhibits extremely good radiation performance in comparison with the case where a conventional can-type semiconductor package is used. This makes it possible to make the light output from the semiconductor laser chip several times higher. Further, in terms of sealing of the semiconductor laser chip, an extremely rigorous cutoff from the outside air is made possible by using a hermetic sealing technology, resistance welding, and a metallic cap, and deterioration of the semiconductor laser chip is favorably reduced in a manner similar to the case where a conventional can-type package is used.

In the semiconductor light-emitting device 20 according to Embodiment 2, the desirable range of height of the gap 140 is 0.1 mm or larger and 4 mm or smaller.

Embodiment 3

Figure 6A:
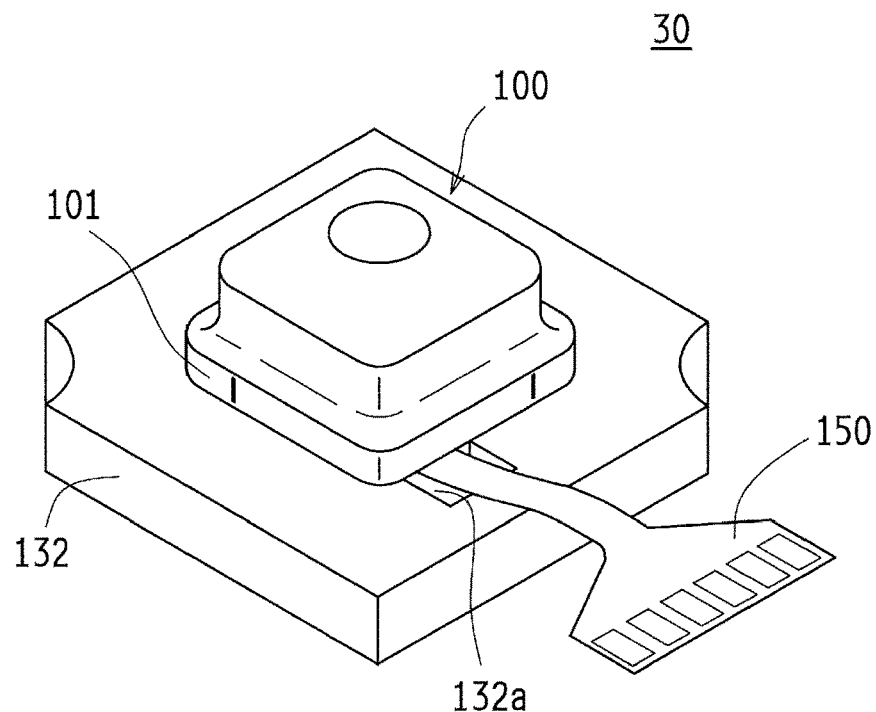
FIG. 6A is a perspective view showing a semiconductor light-emitting device according to Embodiment 3.
Figure 6B:
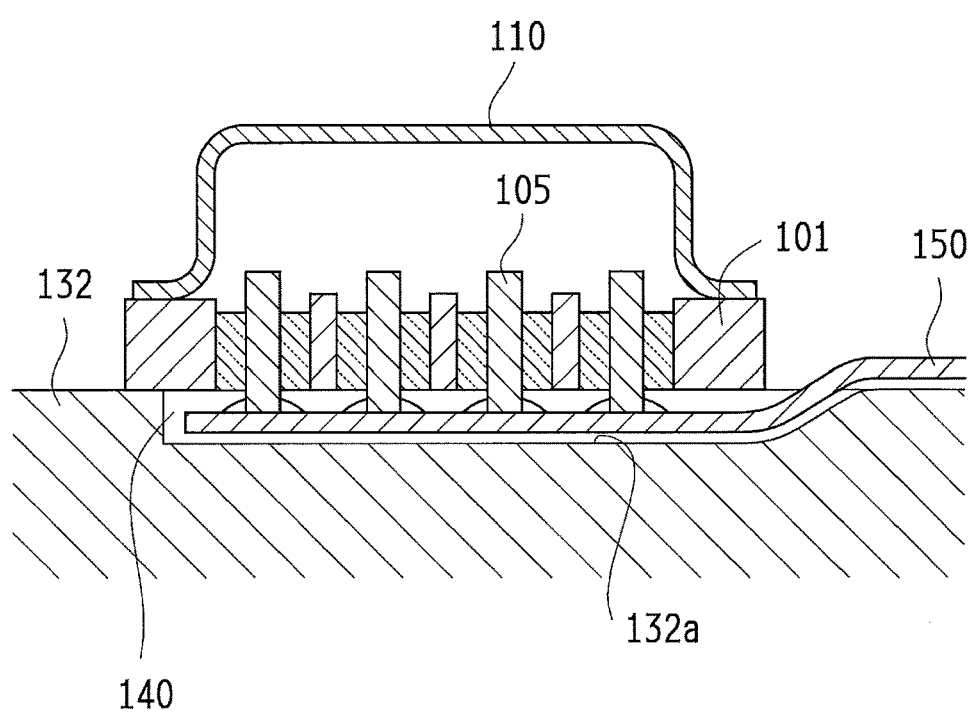
FIG. 6B is a cross-sectional view showing a coupling structure in a gap in the semiconductor light-emitting device.

A semiconductor light-emitting device according to Embodiment 3 is described with reference to FIGS. 6A and 6B. FIG. 6A is a perspective view showing a semiconductor light-emitting device 30 according to Embodiment 3, and FIG. 6B is a cross-sectional view showing a coupling structure in a gap in the semiconductor light-emitting device 30.

The semiconductor light-emitting device 30 includes a heat sink 132 and a can-type semiconductor light-emitting element 100 mounted on the heat sink 132. That is, the semiconductor light-emitting device 30 is configured such that the heat sink 132 is used instead of the heat sink 130 according to Embodiment 1.

The heat sink 132 has a groove 132a in a part of an upper surface of a region in the heat sink 132 on which the base 101 is mounted. The groove 132a is provided in correspondence with the region where the plurality of through holes 103 are disposed, and the groove 132a has one end extending farther outward than an outer edge of the base 101. The semiconductor light-emitting device 30 has a gap 140 formed by the groove 132a between the base 101 and the heat sink 132.

In the semiconductor light-emitting device 10 according to Embodiment 1, the gap 140 is formed by toe step formed in the heat sink 130, and in a plan view, the gap 140 has an opening facing one side of the base 101 along which the plurality of through holes 103 are arranged. Thus, in the semiconductor light-emitting device 10, the flexible substrate 150 is drawn in a direction away from the semiconductor laser chip 122 with reference to the lead 105.

As opposed to this, in the semiconductor light-emitting device 30 according to Embodiment 3, the gap 140 has an opening facing one side of the base 101 to which the arrangement of through holes 103 extends. Moreover, the flexible substrate 150 is drawn through the opening in a direction parallel to a longitudinal direction of the semiconductor laser chip 122. The configuration of Embodiment 3 brings about effects which are similar to those which are brought about by each of the embodiments described above.

In the semiconductor light-emitting device 30 shown in FIGS. 6A and 6E, the groove 132a is formed in the heat sink 132, and the groove 132a serves as the gap 140 between the base 101 and the heat sink 132. However, a modification of the semiconductor light-emitting device 30 may be configured such that a groove is provided in the base 101 of the semiconductor light-emitting element 100 and the groove serves as a gap 140.

Embodiment 4

Figure 7A:
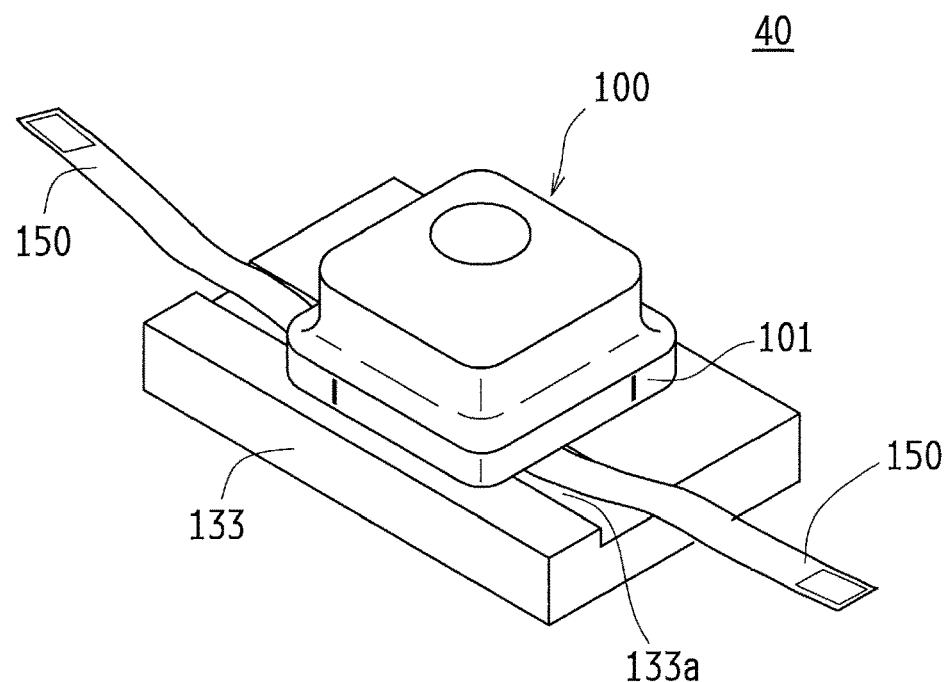
FIG. 7A is a perspective view showing a semiconductor light-emitting device according to Embodiment 4.
Figure 7B:
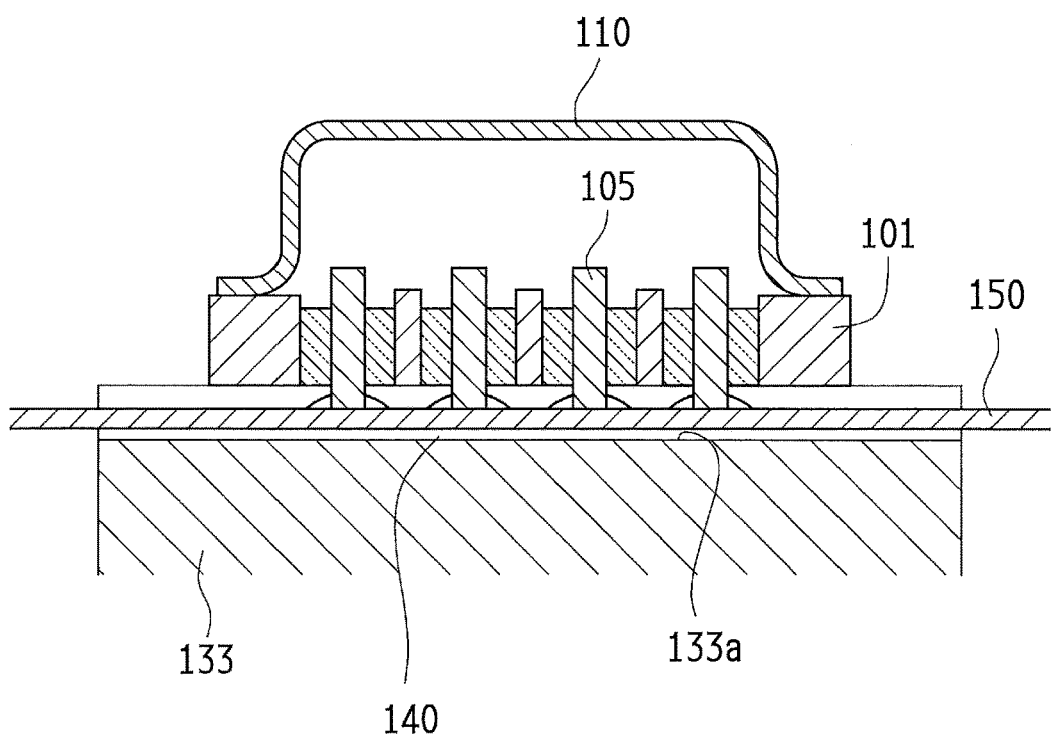
FIG. 7B is a cross-sectional view showing a coupling structure in a gap in the semiconductor light-emitting device.

A semiconductor light-emitting device according to Embodiment 4 is described with reference to FIGS. 7A and 7B. FIG. 7A is a perspective view showing a semiconductor light-emitting device 40 according to Embodiment 4, and FIG. 7B is a cross-sectional view showing a coupling structure in a gap in the semiconductor light-emitting device 40.

The semiconductor light-emitting device 40 includes a heat sink 133 and a can-type semiconductor light-emitting element 100 mounted on the heat sink 133. That is, the semiconductor light-emitting device 40 is configured such that the heat sink 133 is used instead of the heat sink 130 according to Embodiment 1.

The heat sink 133 has a groove 133a in a part of an upper surface of a region in the heat sink 133 on which the base 101 is mounted. The groove 133a is provided in correspondence with the region where the plurality of through holes 103 are disposed, and the groove 133a has both ends extending farther outward than outer edges of the base 101. The semiconductor light-emitting device 40 has a gap 140 formed by the groove 133a between the base 101 and the heat sink 133.

In the semiconductor light-emitting device 30 according to Embodiment 3, the gap 140 has an opening facing one side surface of the base 101. On the other hand, in the semiconductor light-emitting device 40, the gap 140 has openings facing two opposed side surfaces, and the flexible substrate 150 is drawn through those openings in two directions with respect to the base 101. The configuration of Embodiment 4 brings about effects which are similar to those which are brought about by each of the embodiments described above.

In the semiconductor light-emitting device 40 shown in FIG. 7, the groove 133a is formed in the heat sink 133, and the groove 133a serves as the gap 140 between the base 101 and the heat sink 133. However, a modification of the semiconductor light-emitting device 40 may be configured such that a groove is provided in the base 101 of the semiconductor light-emitting element 100 and the groove serves as a gap 140.

Embodiment 5

Figure 8:
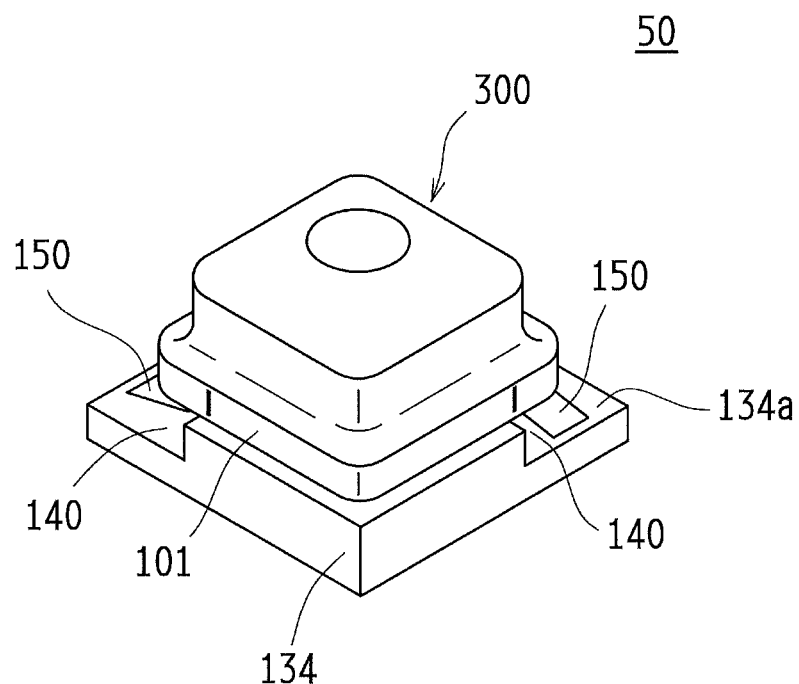
FIG. 8 is a perspective view showing a semiconductor light-emitting device according to Embodiment 5.
Figure 9:
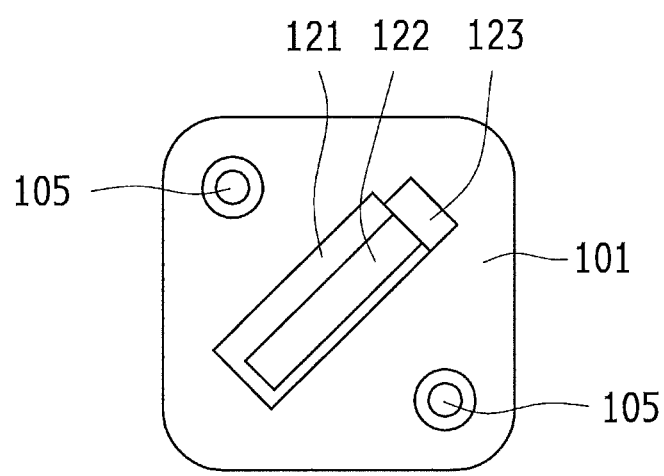
FIG. 9 is a perspective view showing an internal structure of a semiconductor light-emitting element that is mounted on the semiconductor light-emitting device of FIG. 8, with a cap of the semiconductor light-emitting element removed.

A semiconductor light-emitting device according to Embodiment 5 is described with reference to FIGS. 8 and 9. FIG. 8 is a perspective view showing a semiconductor light-emitting device 50 according to Embodiment 5. FIG. 9 is a perspective view showing an internal structure of a semiconductor light-emitting element 300 that is used in the semiconductor light-emitting device 50, with a cap 110 of the semiconductor light-emitting element 300 removed.

The semiconductor light-emitting device 50 includes a heat sink 134 and a can-type semiconductor light-emitting element 300 mounted on the heat sink 134. Moreover, in the semiconductor light-emitting element 300, a set of the sub-mount 121, the semiconductor laser chip 122, and the mirror 123 is placed on the upper surface of the base 101 so that the waveguide longitudinal direction of the semiconductor laser chip 122 extends along one diagonal line of the base 101. Furthermore, leads 105 are provided near two opposite corners on the other diagonal line.

The heat sink 134 has steps 134a formed in correspondence with the positions where the leads 105 are provided, and the semiconductor light-emitting device 50 has gaps 140 formed by the steps 134a between the base 101 and the heat sink 134. In the gap 140, the leads 105 have their respective lower ends connected to a common flexible substrate 150 so that the semiconductor laser chip 122 can be supplied with electric power from an outside source.

As with each of the embodiments described above, the semiconductor light-emitting device 50 too is configured such that the semiconductor laser chip 122 is placed in a region on the base 101 where the gaps 140 are not provided and heat radiated from the semiconductor laser chip 122 is favorably conducted to the heat sink 134. That is, the configuration of Embodiment 5 too brings about effects which are similar to those which are brought about by each of the embodiments described above.

Further, the semiconductor light-emitting device 50 includes a semiconductor light-emitting element 300 having its semiconductor laser chip 122 disposed along a diagonal line of the base 101. For this reason, in comparison with the semiconductor light-emitting element 100 used in Embodiment 1, a semiconductor laser chip 122 whose resonator is relatively long can be mounted over the base 101. This makes it possible to achieve the semiconductor light-emitting device 50 with a smaller outer size.

In the semiconductor light-emitting device 50 shown in FIGS. 8 and 9, the steps 134a are formed in the heat sink 134, and the steps 134a serve as the gaps 140 between the base 101 and the heat sink 134. However, a modification of the semiconductor light-emitting device 50 may be configured such that notches (steps) are provided in the base 101 of the semiconductor light-emitting element 100 and the notches serve as gaps 140.

Embodiment 6

Figure 10:
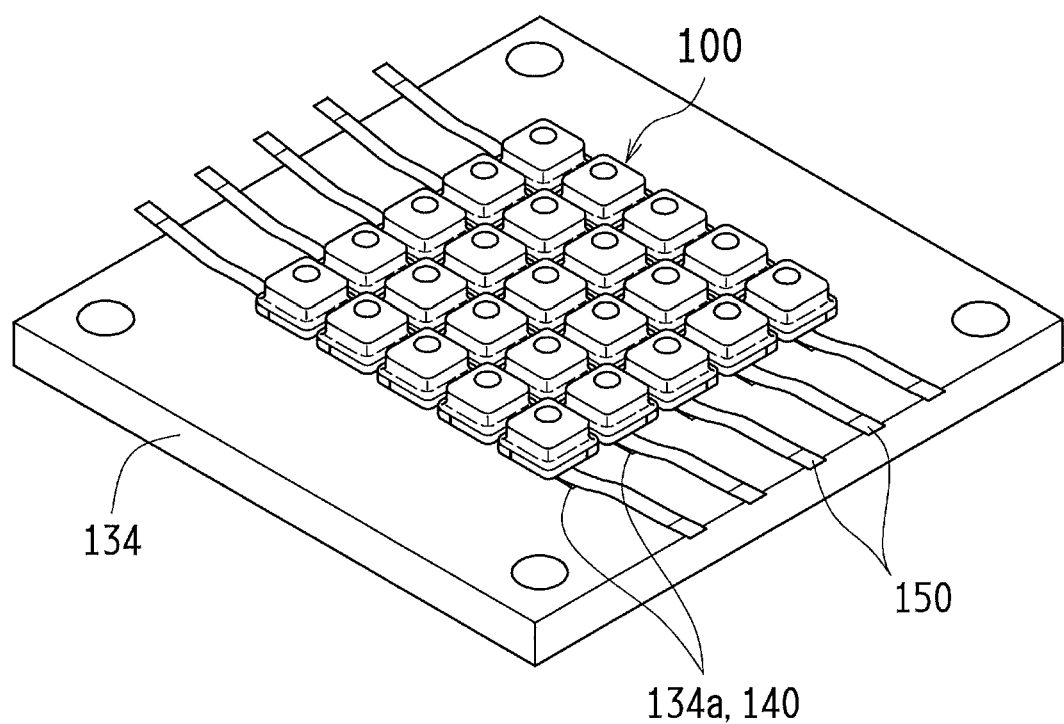
FIG. 10 is a perspective view showing a semiconductor light-emitting device according to Embodiment 6.

A semiconductor light-emitting device according to Embodiment 6 is described with reference to FIG. 10. FIG. 10 is a perspective view showing a semiconductor light-emitting device 60 according to Embodiment 6. The semiconductor light-emitting device 60 according to Embodiment 6 illustrates a configuration in which semiconductor light-emitting devices 40 according to Embodiment 4 are integrated and a plurality of semiconductor light-emitting elements 100 are integrated and mounted on a single heat sink 133. In a case where a plurality of semiconductor light-emitting elements are integrated on a single heat sink, it is conceivable that the semiconductor light-emitting elements are arranged in a line or a matrix. In the following description, however, the semiconductor light-emitting device 60 illustrates an arrangement of semiconductor light-emitting elements 100 in a matrix.

In the semiconductor light-emitting device 60, the heat sink 133 has a plurality of (in FIG. 10, five) grooves 133a provided parallel to one another, and each of the grooves 133a has such a length that a plurality of (in FIG. 10, five) semiconductor light-emitting elements 100 can be disposed on the groove 133a. Thus, in the semiconductor light-emitting device 60, the plurality of semiconductor light-emitting elements 100 are densely arranged side by side in a matrix (in FIG. 10, a 5×5 matrix) on the heat sink 133.

In each of the semiconductor light-emitting elements 100 mounted in the semiconductor light-emitting device 60, gaps 140 constituted by the grooves 133a formed in the heat sink 133 are each provided along one side of each of the bases 101 disposed in an identical line of the matrix. Moreover, in each of the gaps 140, the leads 105 fixed in each of the bases 101 have their lower ends connected to a flexible substrate 150 so that the semiconductor laser chip 122 in each of the semiconductor light-emitting elements 100 is supplied with electric power. At this point, each of the semiconductor laser chips 122 of the plurality of semiconductor light-emitting elements 100 arranged in an identical line of the matrix is supplied with electric power through the common flexible substrate 150. With such an arrangement, the plurality of semiconductor light-emitting elements 100 can be densely arranged in a matrix with the heat sink 133 in close contact with the bottom surface of the base 101 of each of the semiconductor light-emitting elements 100. Further, the semiconductor light-emitting device 60 can be configured such that luminous points are placed at identical pitches.

As with each of the embodiments described above, the semiconductor light-emitting device 60 is extremely good at hermetic sealing of each of the semiconductor laser chips 122, free from deterioration of the semiconductor laser chips 122 due to incomplete sealing, and superior in reliability.

Further, in each of the semiconductor light-emitting elements 100, the semiconductor laser chip 122 is individually mounted on the base 101 and sealed with the cap 110. This makes it possible to use, as each of the semiconductor is elements 100, one selected through characteristic evaluation at that point in time. This works very much in favor of production as compared with a case where a plurality of semiconductor laser chips are simply stored in an internal space of an identical cap. That is, when a large number of semiconductor laser chips are collectively placed on a common base, wire-bonded, and sealed with a cap en bloc, characteristic evaluation of the semiconductor laser chips become first possible after they have been sealed en bloc. Therefore, corrections can no longer be made at the point in time where intrusion of defective chips or variation in characteristic among the semiconductor laser chips comes out after the semiconductor laser chips have been sealed en bloc.

Meanwhile, in the semiconductor light-emitting device 60 according to Embodiment 6, the semiconductor light-emitting elements 100 whose semiconductor laser chips 122 are each individually sealed are subjected to characteristic evaluation, selected, and then integrated on the heat sink 133. This makes it possible to prevent intrusion of defective chips and prevent the semiconductor light-emitting device 60, which is an integrated package, from being defective as a whole. This makes it possible to manufacture the semiconductor light-emitting device 60 at a high yield rate and achieve a highly-reliable integrated package at low cost.

Further, as noted in each of the embodiments described above, the semiconductor light-emitting device 60 is far superior in radiation performance to a semiconductor light-emitting device including can-type semiconductor light-emitting elements. Further, dense integration can be done while passage of electricity to the semiconductor laser chips is secured. This makes it possible to minimize the spread of luminous points as the whole integrated package.

As an example, when the base 101 of each of the semiconductor light-emitting elements 100 has a planar size measuring approximately 6 mm per side, it is possible to output 5 watts of blue light from each of the elements, and when arranged in a 5×5 matrix, the elements can produce a laser output of 125 W as a whole. At this time, the luminous points fall within an area measuring only 24 mm per side; therefore, for example, one-point focusing is made possible with a condensing lens having a diameter of 40 mm. Thus, the semiconductor light-emitting device 60 according to Embodiment 6 can attain a compact laser output exceeding 100 W and, as such, is extremely suitable as a light source for applications such as a laser processing apparatus, a laser welding machine, a laser soldering machine, a 3D printer, a projector. Meanwhile, in the case of use of conventional 5.6 mm diameter can-type packages, which are vastly inferior in thermal resistance as mentioned above, only approximately 2 watts of blue light can be outputted from each of the semiconductor light-emitting chips. The difference is clear.

Figure 11:
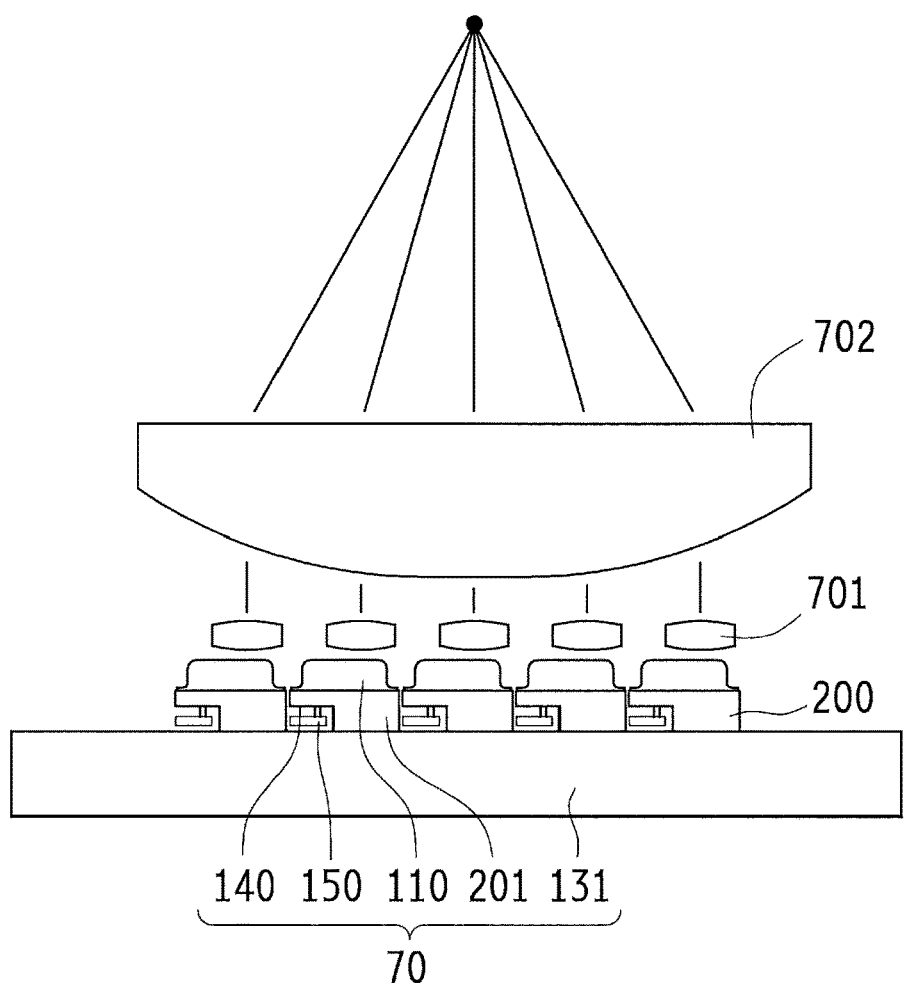
FIG. 11 is a cross-sectional view schematically showing an example of a light-gathering system including a modification of the semiconductor light-emitting device according to Embodiment 6.

FIG. 11 is a cross-sectional view schematically showing an example of a light-gathering system including a modification of the semiconductor light-emitting device according to Embodiment 6. The semiconductor light-emitting device 70 according to the present modification illustrates a configuration in which semiconductor light-emitting devices 20 according to Embodiment 2 are integrated and a plurality of semiconductor light-emitting elements 200 are integrated and mounted on a single heat sink 131.

In the semiconductor light-emitting device 70, collimator lenses 701 that collimate laser beams emitted upward are disposed over the semiconductor light-emitting elements 200, respectively. Collimated beams transmitted through the collimating lenses 701 are condensed by a condensing lens 702 into a light-gathering region, which is a single spot or a narrow region, so that a high output of light power can be utilized. It is understood here that in order to make the optical system compact, it is important to reduce the aperture of the condensing lens 702 by reducing the area of a region of distribution of the luminous points of the semiconductor light-emitting device 70.

As with the semiconductor light-emitting device according to each of the embodiments described above, the semiconductor light-emitting device 70 favorably allows heat to be conducted from the semiconductor laser chips toward the heat sink and to be diffused within the heat sink. Further, the semiconductor laser chips can be densely arranged while the semiconductor laser chips are supplied with electric power through the flexible substrates. This makes it possible to achieve a compact and high-power laser light source.

In the foregoing, each of the embodiments has described an example in which a semiconductor laser chip is used as a semiconductor light-emitting chip. Alternatively, a semiconductor light-emitting device of the present disclosure can be similarly constituted by using an edge emitting light-emitting superluminescence diode. Further, although each of the embodiments has illustrated a configuration in which the formation of a gap is achieved by either a step or groove of a heat sink or a notch of a base bottom surface, a gap may also be formed by both a step of a heat sink and a notch of a base bottom surface.

Further, although the integrated semiconductor light-emitting devices 60 and 70 according to Embodiment 6 have been described as applications of Embodiment 4 or 2, it is clear that an integrated semiconductor light-emitting device can also be constituted on the basis of a semiconductor light-emitting device according to another embodiment, and such a semiconductor light-emitting device too can be one form of semiconductor light-emitting device of the present disclosure.

The embodiments disclosed herein are examples in all respects and do not serve as the basis for limited interpretation. Accordingly, the technical scope of the present disclosure is not interpreted solely by the embodiments described above but is defined on the basis of the recitations in the scope of the claims. Further, all alterations falling within the meaning and range of equivalents of the scope of the claims are encompassed.

The present disclosure contains subject matter related to that disclosed in Japanese Priority Patent Application JP 2018-040058 filed in the Japan Patent Office on Mar. 6, 2018, the entire contents of which are hereby incorporated by reference.

What is claimed is:

1. A semiconductor light-emitting device comprising:
a heat sink made of metal; and
a semiconductor light-emitting element, mounted on the heat sink, that has a base, the heat sink being larger in area than the base,
wherein the semiconductor light-emitting element includes
the base made of sheet metal,
a cap, mounted on the base, that includes a window made of an optically transparent member,
a semiconductor light-emitting chip, mounted over an upper surface of the base, that includes a waveguide,
an optical path bending member that converts an optical path of an emitted beam from a waveguide edge of the semiconductor light-emitting chip into an upward optical path and lets the emitted beam exit through the window, and
a lead for supplying electric power to the semiconductor light-emitting chip,
an upper end of the lead, the semiconductor light-emitting chip, and the optical path bending member are stored in an internal space surrounded by the cap and the base,
the base is mounted on the heat sink and provided with a gap between a region of a part of a lower surface of the base and an upper surface of the heat sink,
the semiconductor light-emitting chip is disposed in a region other than a region where the gap is provided so that a waveguide longitudinal direction of the semiconductor light-emitting chip is substantially parallel to the upper surface of the base,
the lead is disposed in the region where the gap is provided so as to vertically pass through the base, and
the lead has its lower end located within the gap and connected to a flexible substrate.

2. The semiconductor light-emitting device according to claim 1, wherein the internal space surrounded by the cap and the base is hermetically sealed.

3. The semiconductor light-emitting device according to claim 1, wherein the gap is constituted by a step provided in a region on the upper surface of the heat sink on which the base is mounted.

4. The semiconductor light-emitting device according to claim 1, wherein the gap is constituted by a notch provided in a lower surface of the base.

5. The semiconductor light-emitting device according to claim 1, wherein the base has a substantially quadrangular shape when seen in a plan view, and
the gap is provided along one side of the substantially quadrangular shape.

6. The semiconductor light-emitting device according to claim 1, wherein the base has a substantially quadrangular shape when seen in a plan view, the semiconductor light-emitting chip is placed so that its waveguide longitudinal direction extends along one diagonal line of the substantially quadrangular shape, and the gap is disposed near two opposite corners of the substantially quadrangular shape on another diagonal line.

7. The semiconductor light-emitting device according to claim 1, wherein a plurality of the semiconductor light-emitting elements are mounted on the heat sink.

8. The semiconductor light-emitting device according to claim 7, wherein the plurality of semiconductor emitting elements are arranged in a line or a matrix on the heat sink, and each of the semiconductor laser chips of the plurality of semiconductor light-emitting elements arranged in the line or an identical line of the matrix is supplied with electric power through the flexible substrate, the flexible substrate being common.

9. The semiconductor light-emitting device according to claim 1, wherein the gap has a height that is 0.1 mm or larger and equal to or smaller than a thickness of the base.

10. The semiconductor light-emitting device according to claim 1, wherein the gap has a height that is 0.1 mm or larger and 4 mm or smaller.

11. The semiconductor light-emitting device according to claim 1, wherein the semiconductor light-emitting chip is constituted by a nitride semiconductor.

* * * * *